(12) United States Patent
Kim et al.

(10) Patent No.: US 6,245,624 B1
(45) Date of Patent: Jun. 12, 2001

(54) METHODS OF FABRICATING FIELD EFFECT TRANSISTORS BY FIRST FORMING HEAVILY DOPED SOURCE/DRAIN REGIONS AND THEN FORMING LIGHTLY DOPED SOURCE/DRAIN REGIONS

(75) Inventors: Hyun-sik Kim, Kyungki-do; Heon-jong Shin, Seoul, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/304,356

(22) Filed: May 4, 1999

(30) Foreign Application Priority Data

Jul. 24, 1998 (KR) ................................... 8-29942

(51) Int. Cl.[7] ............................................. H01L 21/336
(52) U.S. Cl. ..................................... 438/305; 438/530
(58) Field of Search ................................. 438/303, 305, 438/306, 307, 527, 529, 530

(56) References Cited

U.S. PATENT DOCUMENTS

| | | | |
|---|---|---|---|
| 4,744,859 | * 5/1988 | Hu et al. | 438/305 |
| 4,753,898 | * 6/1988 | Parrillo et al. | 438/305 |
| 4,843,023 | * 6/1989 | Chiu et al. | 438/305 |
| 4,933,994 | * 6/1990 | Orban | 438/307 |
| 5,215,937 | 6/1993 | Erb et al. | 437/45 |
| 5,554,876 | 9/1996 | Kusunoki et al. | 257/411 |
| 5,710,450 | 1/1998 | Chau et al. | 257/344 |
| 6,010,936 | * 1/2000 | Son | 438/303 |

* cited by examiner

Primary Examiner—Chandra Chaudhari
(74) Attorney, Agent, or Firm—Myers Bigel Sibley & Sajovec

(57) ABSTRACT

Heavily doped source/drain regions are formed in an integrated circuit substrate prior to forming lightly doped source/drain regions in the integrated circuit substrate. High temperature thermal processing preferably is carried out prior to forming the lightly doped source/drain regions in the integrated circuit substrate. Reduced short channel effects may thereby be obtained while still achieving shallow junctions. More specifically, an insulated gate electrode comprising polysilicon is formed on an integrated circuit substrate. The insulated gate electrode is oxidized. A gate spacer is formed on the oxidized sidewalls of the insulated gate electrode. Heavily doped source/drain regions are formed in the integrated circuit substrate by first implanting ions into the integrated circuit substrate using the insulated gate electrode and the gate spacer on the oxidized sidewalls of the insulated gate electrode as an implantation mask. The gate spacer is removed from the oxidized sidewalls of the insulated gate electrode after performing the step of forming heavily doped source/drain regions in the integrated circuit substrate. Finally, lightly doped source/drain regions, that are lightly doped relative to the heavily doped source/drain regions, are formed in the integrated circuit substrate. The lightly doped source/drain regions are formed by implanting ions into the integrated circuit substrate using the insulated gate electrode as an implantation mask, after performing the step of removing the gate spacers from the oxidized sidewalls of the insulated gate electrode.

17 Claims, 6 Drawing Sheets

METHODS OF FABRICATING FIELD EFFECT TRANSISTORS BY FIRST FORMING HEAVILY DOPED SOURCE/DRAIN REGIONS AND THEN FORMING LIGHTLY DOPED SOURCE/DRAIN REGIONS

FIELD OF THE INVENTION

This invention relates to integrated circuit fabrication methods, and more particularly to methods of fabricating integrated circuit Field Effect Transistors (FET), often referred to as Metal Oxide Semiconductor (MOS) FETs.

BACKGROUND OF THE INVENTION

Integrated circuit field effect transistors are widely used in microelectronic devices. As the integration density of integrated circuits continues to increase, the size of the field effect transistors in the integrated circuit may continue to decrease. Unfortunately, as the size continues to decrease below half micron channel length, short channel effects arise that may degrade the performance of the field effect transistor. Short channel effects may occur when the depletion regions of the source/drain regions of the field effect transistor expand into the channel to reduce the length of the effective channel. This may cause the threshold voltage to drop and/or other undesired effects.

In order to reduce short channel effects it is known to reduce the thickness of the gate insulating layer, the width of the depletion region under the gate and/or the doping concentration of the integrated circuit substrate. It is also known to provide shallow source/drain junction regions.

It is also known to provide integrated circuit field effect transistors with both lightly doped and heavily doped source/drain regions. It will be understood that the terms "lightly doped" and "heavily doped" refer to doping levels relative to one another. Thus, for example, lightly doped source/drain structures also include moderately doped source/drain structures that can provide a higher doping level than a conventional lightly doped source/drain structure while still being lightly doped relative to the heavily doped source/drain structure. Unfortunately, the increased doping level in a moderately doped source/drain structure may worsen short channel effects.

A conventional fabrication method for integrated circuit field effect transistors including both lightly doped source/drain regions and heavily doped source/drain regions is described in U.S. Pat. No. 5,710,450 to Chau et al., entitled *"Transistor with Ultra Shallow Tip and Method of Fabrication."* In such a conventional integrated circuit field effect transistor fabrication method, a gate insulating film is formed on an integrated circuit substrate such as a silicon semiconductor substrate. A gate electrode, preferably comprising polysilicon, is formed on the gate insulating layer. Then, lightly doped source/drain regions having shallow junctions are formed using the gate electrode as an ion implantation mask. Gate spacers are formed on the sidewalls of the gate electrodes. Heavily doped source/drain regions are formed, that are heavily doped relative to the lightly doped source/drain regions, using the gate electrode and the gate spacers as an ion implantation mask. The resultant structure is thermally treated thereby forming an integrated circuit field effect transistor. See also U.S. Pat. No. 5,215,937 to Erb et al., entitled *"Optimizing Doping Control in Short Channel MOS."*

In a conventional method, after the shallow junction of the lightly doped source/drain (including a moderately doped source/drain) is formed, gate spacer formation may be performed at temperatures of between about 450° C. to about 600° C. Moreover, after the ion implantation of the heavily doped source/drain region, a thermal anneal may be performed at about 1000° C. Unfortunately, the gate spacer formation process and/or the thermal treatment may cause redistribution of silicon atoms and diffusion of dopants within the integrated circuit substrate. Short channel effects may therefore increase and the performance of the integrated circuit field effect transistor may degrade.

SUMMARY OF THE INVENTION

It is therefore an object of the present invention to provide improved methods of fabricating integrated circuit field effect transistors.

It is another object of the invention to provide methods of fabricating integrated circuit field effect transistors that can reduce short channel effects.

It is still another object of the present invention to provide methods of fabricating integrated circuit field effect transistors that can reduce redistribution of silicon atoms and/or diffusion of dopants within an integrated circuit substrate under high temperature process conditions, while still allowing shallow junctions to be formed.

These and other objects are provided, according to the present invention, by forming heavily doped source/drain regions in an integrated circuit substrate prior to forming lightly doped source/drain regions in the integrated circuit substrate. High temperature thermal processing preferably is carried out prior to forming the lightly doped source/drain regions in the integrated circuit substrate. Reduced short channel effects may thereby be obtained while still achieving shallow junctions.

More specifically, methods of fabricating integrated circuit field effect transistors according to the present invention form an insulated gate electrode comprising polysilicon on an integrated circuit substrate. The insulated gate electrode is oxidized. A gate spacer is formed on the oxidized sidewalls of the insulated gate electrode. Heavily doped source/drain regions are formed in the integrated circuit substrate by first implanting ions into the integrated circuit substrate using the insulated gate electrode and the gate spacer on the oxidized sidewalls of the insulated gate electrode as an implantation mask. The gate spacer is removed from the oxidized sidewalls of the insulated gate electrode after performing the step of forming heavily doped source/drain regions in the integrated circuit substrate. Finally, lightly doped source/drain regions, that are lightly doped relative to the heavily doped source/drain regions, are formed in the integrated circuit substrate. The lightly doped source/drain regions are formed by implanting ions into the integrated circuit substrate using the insulated gate electrode as an implantation mask, after performing the step of removing the gate spacer from the oxidized sidewalls of the insulated gate electrode.

In a particular embodiment, a buffer layer is formed on the integrated circuit substrate including on the oxidized insulated gate electrode, between the steps of oxidizing the insulated gate electrode and forming a gate spacer on the oxidized sidewalls of the insulated gate electrode. The gate spacer is then formed on the buffer layer on the oxidized sidewalls of the insulated gate electrode.

Preferably, the insulated gate electrode is oxidized to form an oxide film of thickness between about 20 Å and about 100 Å thereon. Moreover, the gate spacer preferably comprises material that has an etch selectivity relative to the buffer layer. For example, the gate spacer may comprise oxide and the buffer layer may comprise silicon oxynitride (SiON). The silicon oxynitride may have a thickness of between about 100 Å and about 300 Å.

The heavily doped source/drain regions may be annealed prior to forming the lightly doped source/drain regions. Moreover, silicide may be formed on the gate electrode and on the heavily doped source/drain regions prior to forming the lightly doped source/drain regions.

After forming the lightly doped source/drain regions, rapid thermal annealing may be performed on the integrated circuit substrate including the lightly doped source/drain regions. The rapid thermal annealing process may be performed at a temperature between about 900° C. and about 1000° C. for between about 10 seconds to about 30 seconds after a ramp-up time of between about 5 seconds and about 20 seconds. The temperature may be increased in two steps to reduce the ramp-up time.

Accordingly, an integrated circuit field effect transistor may be fabricated by forming an insulated gate electrode including a gate spacer on the sidewall thereof on an integrated circuit substrate. Heavily doped source/drain regions are formed in the integrated circuit substrate by first implanting ions into the integrated circuit substrate using the insulated gate electrode and the gate spacer on the sidewalls thereof as an implantation mask. The gate spacer is removed from the sidewalls of the insulated gate electrode after performing the step of forming heavily doped source/drain regions in the integrated circuit substrate. Then, lightly doped source/drain regions are formed in the integrated circuit, that are lightly doped relative to the heavily doped source/drain regions, by implanting ions into the integrated circuit substrate using the insulated gate electrode as an implantation mask, after performing the step of removing the gate spacer from the sidewalls of the insulated gate electrode.

Thus, heavily doped source/drain regions are formed in the insulated circuit substrate by first implanting ions into the integrated circuit substrate using the insulated gate electrode as an implantation mask. Then, lightly doped source/drain regions are formed in the integrated circuit substrate by implanting ions into the integrated circuit substrate using the insulated gate electrode as an implantation mask, after performing the step of forming heavily doped source/drain regions in the integrated circuit substrate. The ion implantation for forming lightly doped source/drain regions therefore is performed after the ion implantation and thermal annealing processes for forming the heavily doped source/drain regions and after the high temperature processing that may be used to form sidewall spacers. Thus, redistribution of silicon atoms and/or diffusion of dopants in the semiconductor substrate due to high temperature processing may be reduced. Short channel effects can be reduced and preferably prevented.

DETAILED DESCRIPTION OF PREFERRED EMBODIMENTS

Figure 1A:
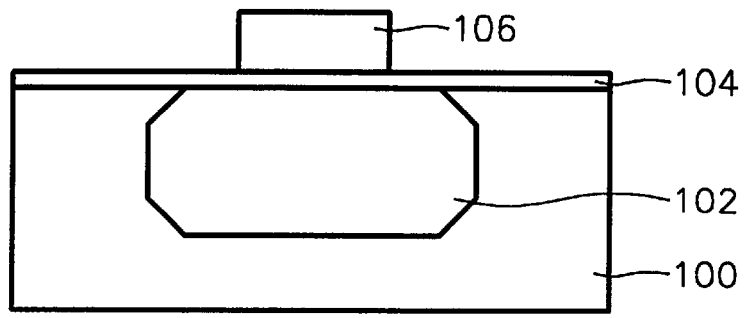
FIGS. 1A–1F are cross-sectional views illustrating first embodiments of methods of fabricating integrated circuit field effect transistors according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Referring now to FIG. 1A, a well region 102 is formed in an integrated circuit substrate 100 such as a silicon semiconductor substrate by ion implantation or other conventional techniques. A gate insulating film 104 is formed on the integrated circuit substrate. For example, a silicon dioxide film of thickness between about 30 Å and about 60 Å may be formed by thermal oxidation. A polysilicon layer between about 2000 Å and about 3000 Å thick is formed on the gate insulating film 104. The polysilicon layer is patterned using conventional techniques to thereby form a gate electrode 106 on the well region 102.

Figure 1B:
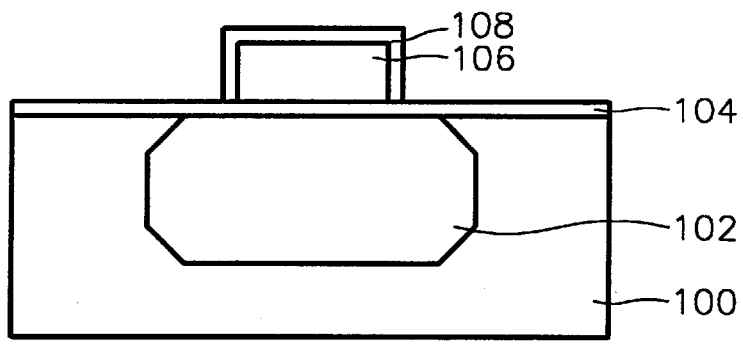

Referring now to FIG. 1B, the polysilicon gate electrode 106 is oxidized to thereby form a first insulating film 108 on the gate electrode 106. The first insulating film is preferably an oxide layer having a thickness between about 20 Å and about 100 Å. It will be understood that the gate electrode may include materials other than polysilicon and need not include polysilicon. The insulating film 108 also need not be oxide and may be omitted.

Figure 1C:
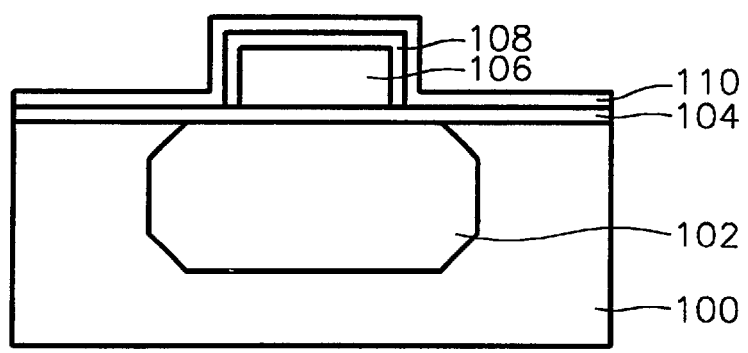

Referring now to FIG. 1C, a buffer layer 110 preferably comprising silicon oxynitride (SiON) is formed on the integrated circuit substrate, including on the oxidized insulated gate electrode 106. The buffer layer 110 may have a thickness of between about 20 Å and about 100 Å. The use of silicon oxynitride in field effect transistors is described in U.S. Pat. No. 5,554,876 to Kusunoki et al. entitled "*Field Effect Transistor Including Silicon Oxide Film and Nitrided Oxide Film as Gate Insulator Film and Manufacturing Method Thereof*".

Figure 1D:
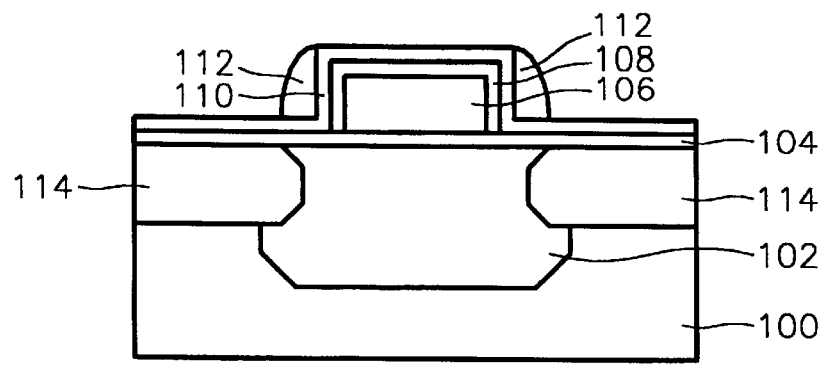

Then, referring to FIG. 1D, an insulating film such as an oxide film or a composite oxide film, having thickness between about 500 Å and about 1500 Å, is deposited on the integrated circuit substrate on which the buffer layer 110 is formed. The insulating film is then anisotropically etched, for example by dry etching, to thereby form gate spacers 112 on the sidewalls of the gate electrode 106. It will be understood that the buffer layer 110 preferably has an etch selectivity relative to the gate spacer 112.

Still referring to FIG. 1D, heavily doped source/drain regions 114 are formed in the integrated circuit substrate by first implanting ions into the integrated circuit substrate using the insulated gate electrode 106 and the gate spacers 112 as an implantation mask. Self-aligned heavily doped source/drain regions 114 may thereby be formed. Ion implantation may be performed at a dose of between about 1E15 atoms/cm² to about 5E15 atoms/cm² at an ion implantation energy of between about 10 KeV and about 30 KeV. The implanted ions may be diffused by performing a rapid thermal anneal for about 30 seconds at a temperature between about 900° C. and about 1000° C. to thereby complete the formation of the heavily doped source/drain regions 114 on opposite sides of the gate electrode 106.

Figure 1E:
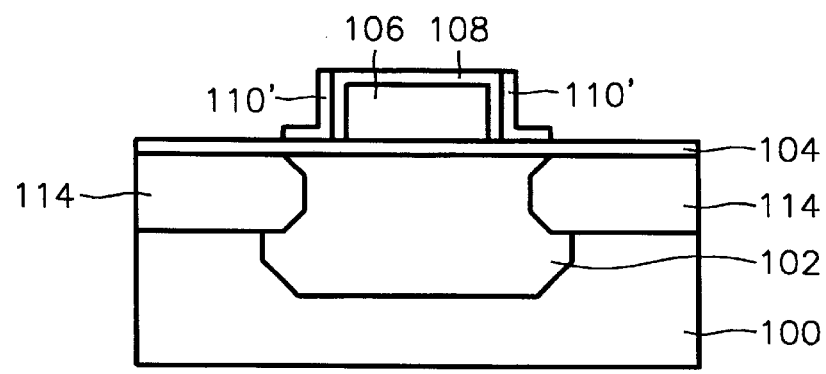

Referring now to FIG. 1E, the gate spacers 112 are removed, for example by wet etching. A wet etching solution that provides etching selectivity between the gate spacers 112 and the buffer layer 110 may be used. The remaining buffer layer 110 thus can act as an etching stopper when the gate spacers 112 are removed. The buffer layer over the gate electrode 106 and on the heavily doped source/drain regions 114 may be etched while the gate spacers 112 are etched so that the buffer layer 110' remains only on the sidewalls of the gate electrode 106 and below the gate spacers 112.

Optionally, the silicon substrate 100 and the top of the gate electrode 106 may be exposed by removing the exposed gate insulating layer 104 and the first insulating film 108. A silicide layer may then be formed on the gate electrode 106 and on the heavily doped source/drain regions 114 by depositing and baking a metal layer on the exposed silicon/polysilicon surfaces. The silicide layer preferably is not formed on the sidewalls of the gate electrode 106 and below the position of the gate spacers 112 due to the blocking effect of the remaining buffer layer 110'. It will also be understood that compared to a conventional process, the above described process for removing the gate spacers 112 may be slightly more complicated. However, the process can reduce and preferably eliminate short channel effects in highly integrated field effect transistors.

Figure 1F:
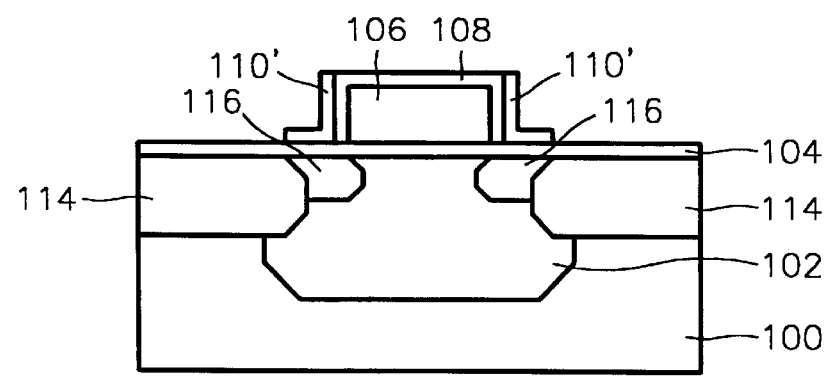

Referring now to FIG. 1F, lightly doped source/drain regions 116 are formed in the integrated circuit substrate. The lightly doped source/drain regions 116 are lightly doped relative to the heavily doped source/drain regions 114. The heavily doped source/drain regions and the lightly doped source/drain regions may have any desirable doping concentration as long as the lightly doped source/drain regions have lower doping concentration than the heavily doped source/drain regions. The lightly doped source/drain regions are formed by implanting ions into the integrated circuit substrate using the insulated gate electrode 106 as an implantation mask. Since the gate spacers 112 have been removed they are not used as an implantation mask. When the ion implantation dopant is N-type, phosphorus, arsenic and antimony are preferably used as ion implantation sources. When the ion implantation dopant is P-type, boron trifluoride, boron and indium preferably are used as ion implantation sources. The second ion implantation may be performed with a dose of between about 1E13 atoms/cm² and about 5E14 atoms/cm² at an ion implantation energy between about 5 KeV and about 30 KeV, and at an ion implantation tilt of between about 7° and about 45°.

Still referring to FIG. 1F, the ions that are implanted into the substrate to form the lightly doped source/drain regions 116 may be diffused by performing rapid thermal processing on the integrated circuit substrate to thereby form the final lightly doped source/drain regions 116. Rapid thermal processing may be performed for between about 10 seconds and about 30 seconds at a temperature of between about 900° C. and about 1000° C. The ramp-up time for increasing the temperature in the rapid thermal processing chamber can be used to prevent diffusion of dopants and to thereby control the effective channel length. The ramp-up may be performed in two steps and the ramp-up time may be performed in a range of between about 5 seconds and about 20 seconds to thereby reduce short channel effects due to redistribution of dopants in the lightly doped source/drain regions 116.

Figure 2A:
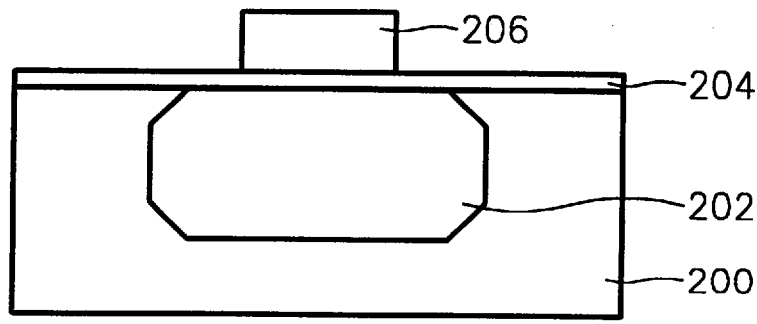
FIGS. 2A–2E are cross-sectional views illustrating second embodiments of methods of fabricating integrated circuit field effect transistors according to the present invention.
Figure 2B:
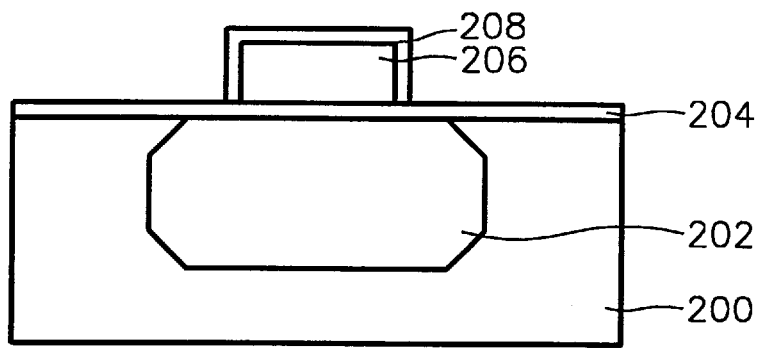

FIGS. 2A–2E are cross-sectional views illustrating methods of fabricating integrated circuit field effect transistors according to a second embodiment of the present invention. In contrast to FIGS. 1A–1F wherein a buffer layer 110 is used as an etching stopper when removing the gate spacers, in the embodiment of FIGS. 2A–2E the buffer layer is not formed. Thus, in FIG. 2A, a gate electrode 206 is formed on a gate insulating layer 204 over a well 202 in an integrated circuit substrate 200, similar to FIG. 1A. In FIG. 2B, the gate electrode 206 is oxidized to form a first insulating film 208, similar to FIG. 1B.

Figure 2C:
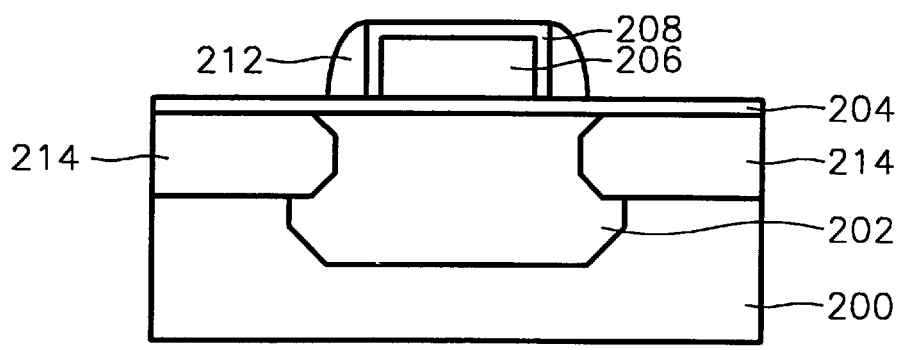

In FIG. 2C, a buffer layer 110 is not formed as was the case in FIG. 1C. Rather, the gate spacers 212 are formed directly on the first insulating film 208 on the sidewalls of gate electrode 206. The first ion implantation is performed using the gate electrode 206 and the gate spacers 212 as an ion implantation mask thereby forming the heavily doped source/drain regions 214. The gate spacers 212 of FIG. 2C preferably have an etch selectivity relative to the first insulating film 208 of FIG. 2B. For example, the gate spacers 212 may be a silicon nitride film or a composite film including silicon nitride.

Figure 2D:
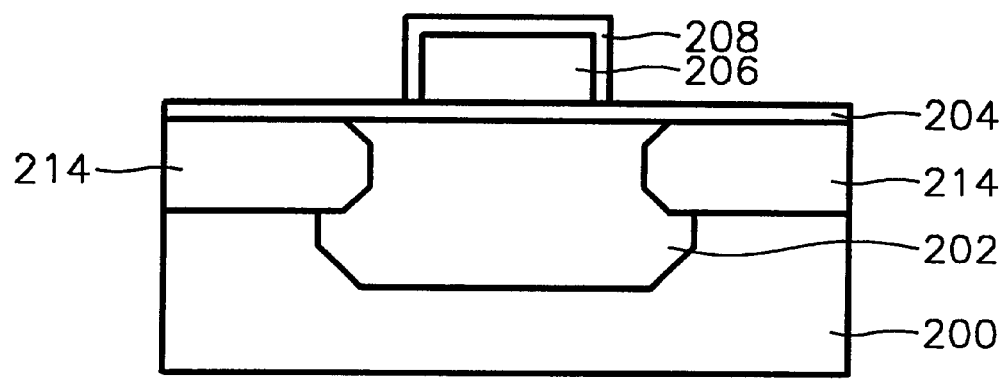
Figure 2E:
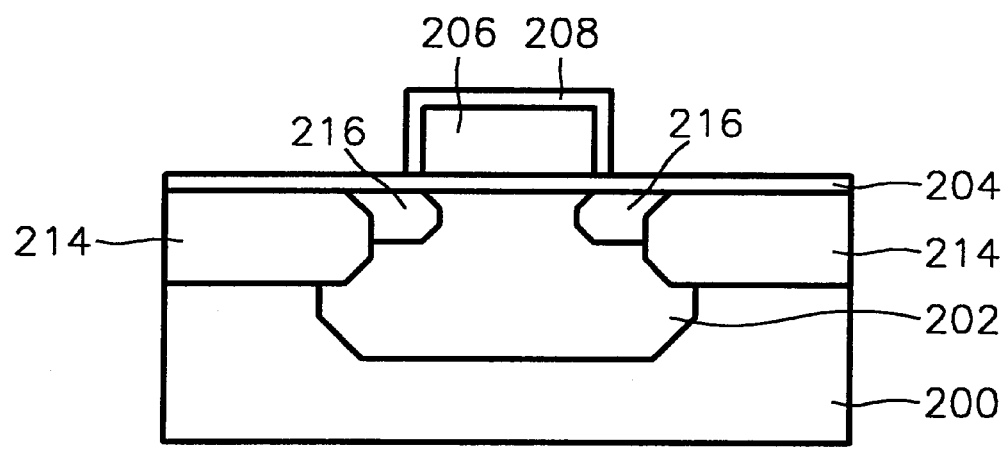

Referring now to FIG. 2D, the gate spacers 212 are removed, preferably by wet etching. Then, as shown in FIG. 2E, a second ion implantation is performed after removing the gate spacers 212 to form the lightly doped source/drain regions 216.

Figure 3:
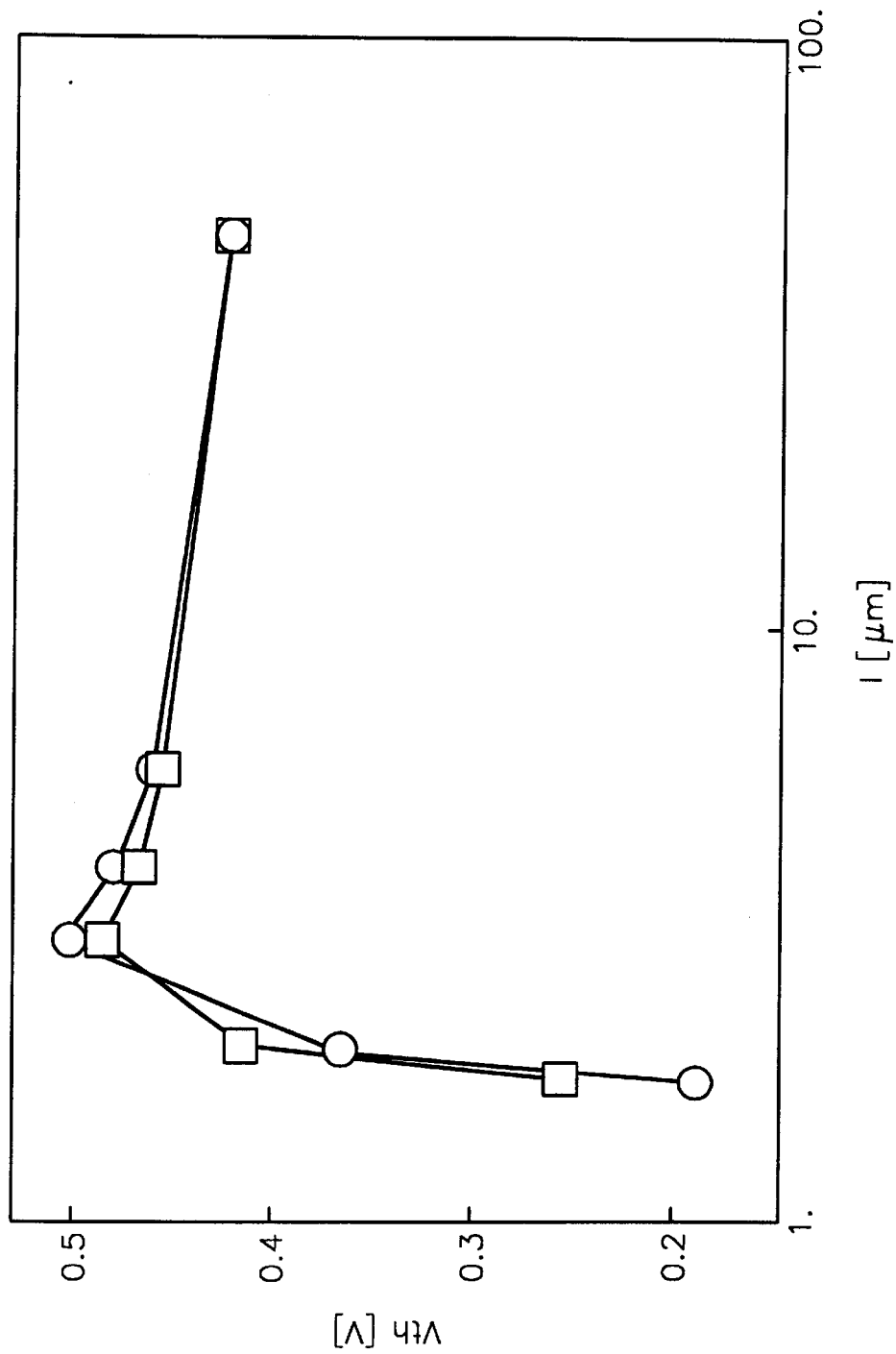
FIGS. 3 and 4 graphically illustrate electrical characteristics of integrated circuit field effect transistors according to the present invention.

FIG. 3 graphically illustrates threshold voltage characteristics relative to gate channel length for integrated circuit field effect transistors that are formed according to FIGS. 1A–1F. In FIG. 3, the X axis designates the gate channel length L in microns and the Y axis designates the threshold voltage V in volts. The line connected by squares represents the characteristics of integrated circuit field effect transistors according to the present invention and the line connected by circles represents the characteristics of a conventional integrated circuit field effect transistor wherein the lightly doped source/drain regions are formed prior to forming the heavily doped source/drain regions. As shown in FIG. 3, the threshold voltage properties of integrated circuit field effect transistors according to the present invention show a stable change relative to the gate channel length.

Figure 4:
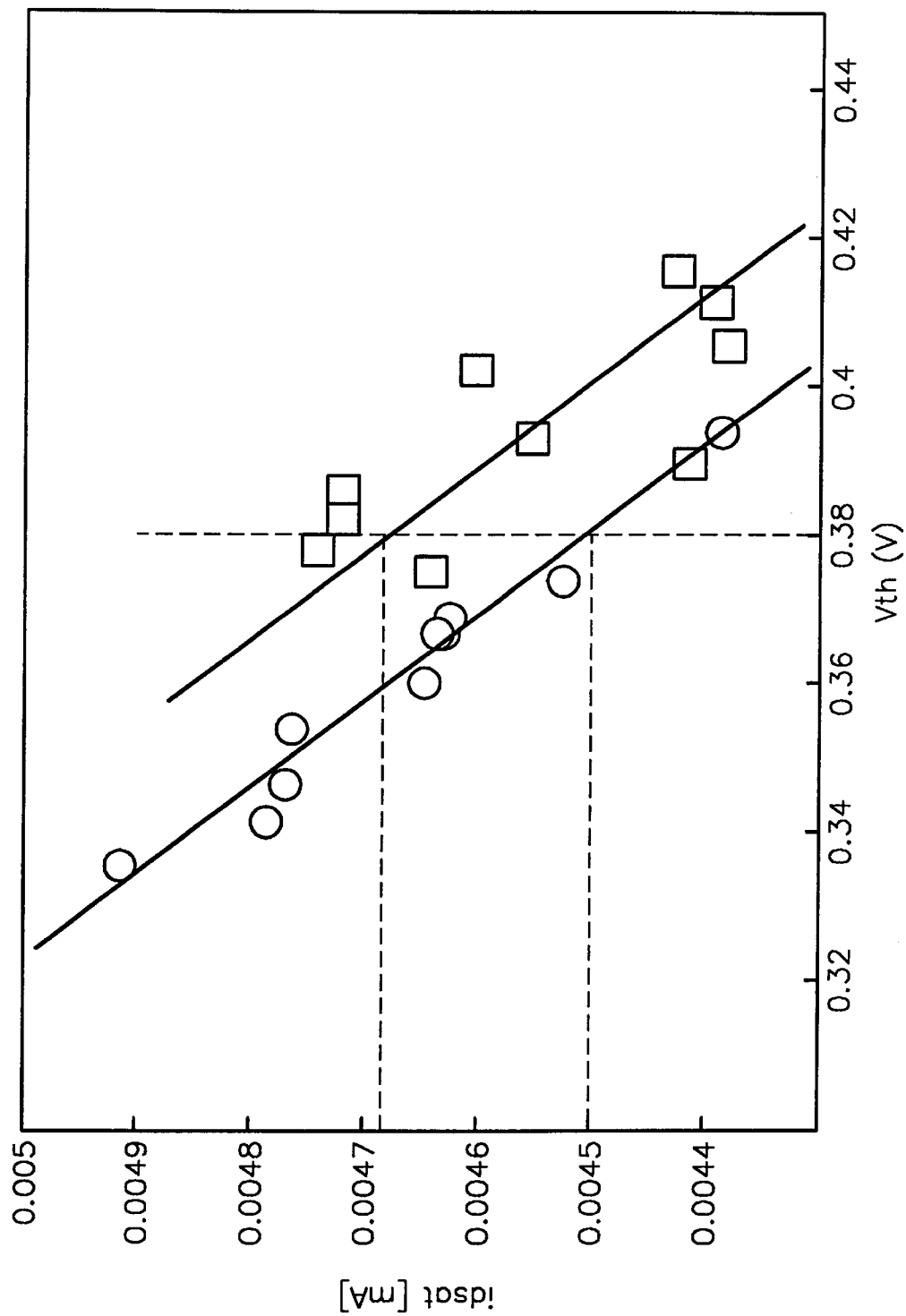

FIG. 4 graphically illustrates drain saturation current (idsat) characteristics relative to threshold voltage for integrated circuit transistors formed according to FIGS. 1A–1F. In FIG. 4, the X axis designates threshold voltage (Vth) in volts and the Y axis designates the drain saturation current (idsat) in milliAmps. The line connected by squares represents integrated circuit field effect transistors according to the present invention and the line connected by circles represents conventional integrated circuit field effect transistors. As shown in FIG. 4, the drain saturation current of integrated circuit field effect transistors according to the present invention may be greater than that of conventional integrated circuit field effect transistors at a threshold voltage of 0.38V. Thus, short channel effects may be improved and the operational speed of the integrated circuit field effect transistor also may be improved.

In conclusion, ion implantation to form lightly doped source/drain regions is performed after ion implantation and thermal treatments that form heavily doped source/drain regions. Redistribution of silicon atoms and/or diffusion of dopants in the semiconductor substrate may be reduced. Short channel effects also may be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating an integrated circuit field effect transistor comprising the steps of:

forming an insulated gate electrode comprising polysilicon on an integrated circuit substrate;

oxidizing the insulated gate electrode;

forming a gate spacer on the oxidized sidewalls of the insulated gate electrode;

forming heavily doped source/drain regions in the integrated circuit substrate by first implanting ions into the integrated circuit substrate using the insulated gate electrode and the gate spacer on the oxidized sidewalls of the insulated gate electrode as an implantation mask; then removing the gate spacer from the oxidized sidewalls of the insulated gate electrode, after performing the step of forming heavily doped source/drain regions in the integrated circuit substrate; then forming silicide on the gate electrode comprising polysilicon and on the heavily doped source/drain regions; and then forming lightly doped source/drain regions in the integrated circuit substrate that are lightly doped relative to the heavily doped source/drain regions, by implanting ions into the integrated circuit substrate using the insulated gate electrode as an implantation mask, after performing the step of removing the gate spacer from the oxidized sidewalls of the insulated gate electrode.

2. A method according to claim 1 wherein the following step is performed between the steps of oxidizing and forming gate spacer:

forming a buffer layer on the integrated circuit substrate, including on the oxidized insulated gate electrode; and wherein the step of forming a gate spacer comprises the step of forming a gate spacer on the buffer layer on the oxidized sidewalls of the insulated gate electrode.

3. A method according to claim 1 wherein the oxidizing step comprises the step of oxidizing the insulated gate electrode comprising polysilicon to form an oxide film of thickness between about 20 Å and about 100 Å thereon.

4. A method according to claim 2 wherein the step of forming a gate spacer comprises the step of forming a gate spacer comprising material that has etch selectivity relative to the buffer layer, on the buffer layer on the oxidized sidewalls of the insulated gate electrode.

5. A method according to claim 4 wherein the gate spacer comprises oxide and wherein the buffer layer comprises silicon oxynitride.

6. A method according to claim 2 wherein the step of forming a buffer layer comprises the step of forming a buffer layer having thickness of between about 100 Å and about 300 Å on the integrated circuit substrate, including on the oxidized insulated gate electrode.

7. A method according to claim 1 wherein the following step is performed between the steps of forming heavily doped source/drain regions and forming lightly doped source/drain regions:

annealing the heavily doped source/drain regions.

8. A method according to claim 1 wherein the step of forming lightly doped source/drain regions comprises the step of implanting ions at a dose between about 1E13 atoms/cm$^2$ and about 5E14 atoms/cm$^2$ and at an implantation energy between about 5 KeV and about 30 KeV.

9. A method according to claim 1 wherein the step of forming lightly doped source/drain regions is followed by the step of rapid thermal annealing the integrated circuit substrate including the lightly doped source/drain regions.

10. A method of fabricating an integrated circuit field effect transistor comprising the steps of:

forming on an integrated circuit substrate, an insulated gate electrode including a gate spacer on sidewalls thereof;

forming heavily doped source/drain regions in the integrated circuit substrate by first implanting ions into the integrated circuit substrate using the insulated gate electrode and the gate spacer on the sidewalls thereof as an implantation mask; then removing the gate spacer from the sidewalls of the insulated gate electrode, after performing the step of forming heavily doped source/drain regions in the integrated circuit substrate; then forming silicide on the insulated gate electrode and on the heavily doped source/drain regions; and then forming lightly doped source/drain regions in the integrated circuit substrate that are lightly doped relative to the heavily doped source/drain regions, by implanting ions into the integrated circuit substrate using the insulated gate electrode as an implantation mask, after performing the step of removing the gate spacer from the sidewalls of the insulated gate electrode.

11. A method according to claim 10 wherein the following step is performed between the steps of forming heavily doped source/drain regions and forming lightly doped source/drain regions:

annealing the heavily doped source/drain regions.

12. A method according to claim 10 wherein the step of forming lightly doped source/drain regions comprises the step of implanting ions at a dose between about 1E13 atoms/cm$^2$ and about 5E14 atoms/cm$^2$ and at an implantation energy between about 5 KeV and about 30 KeV.

13. A method according to claim 10 wherein the step of forming lightly doped source/drain regions is followed by the step of rapid thermal annealing the integrated circuit substrate including the lightly doped source/drain regions.

14. A method of fabricating an integrated circuit field effect transistor comprising the steps of:

forming an insulated gate electrode on an integrated circuit substrate;

forming heavily doped source/drain regions in the integrated circuit substrate by first implanting ions into the integrated circuit substrate using the insulated gate electrode as an implantation mask; then forming silicide on the insulated gate electrode and on the heavily doped source/drain regions; and then forming lightly doped source/drain regions in the integrated circuit substrate that are lightly doped relative to the heavily doped source/drain regions, by implanting ions into the integrated circuit substrate using the insulated gate electrode as an implantation mask, after performing the step of forming heavily doped source/drain regions in the integrated circuit substrate.

15. A method according to claim 14 wherein the following step is performed between the steps of forming heavily doped source/drain regions and forming lightly doped source/drain regions:

annealing the heavily doped source/drain regions.

16. A method according to claim 14 wherein the step of forming lightly doped source/drain regions comprises the step of implanting ions at a dose between about 1E13 atoms/cm$^2$ and about 5E14 atoms/cm$^2$ and at an implantation energy between about 5 KeV and about 30 KeV.

17. A method according to claim 14 wherein the step of forming lightly doped source/drain regions is followed by the step of rapid thermal annealing the integrated circuit substrate including the lightly doped source/drain regions.

* * * * *